United States Patent
Koo

(10) Patent No.: US 11,543,463 B2
(45) Date of Patent: Jan. 3, 2023

(54) APPARATUS AND METHOD FOR DIAGNOSING FAILURE IN A BLOWER OF A VEHICLE

(71) Applicants: HYUNDAI MOTOR COMPANY, Seoul (KR); KIA MOTORS CORPORATION, Seoul (KR)

(72) Inventor: Bon Chang Koo, Seongnam-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 317 days.

(21) Appl. No.: 16/917,411

(22) Filed: Jun. 30, 2020

(65) Prior Publication Data
US 2021/0173018 A1    Jun. 10, 2021

(30) Foreign Application Priority Data
Dec. 4, 2019 (KR) .................. 10-2019-0160014

(51) Int. Cl.
| G01R 31/00 | (2006.01) |
| G01R 31/56 | (2020.01) |
| G01R 19/165 | (2006.01) |
| G01R 31/385 | (2019.01) |
| B60K 35/00 | (2006.01) |
| G01K 13/00 | (2021.01) |
| G01K 3/00 | (2006.01) |

(52) U.S. Cl.
CPC .............. *G01R 31/56* (2020.01); *B60K 35/00* (2013.01); *G01K 3/005* (2013.01); *G01K 13/00* (2013.01); *G01R 19/165* (2013.01); *G01R 31/005* (2013.01); *G01R 31/385* (2019.01)

(58) Field of Classification Search
CPC .... G01R 31/56; G01R 31/385; G01R 19/165; G01R 31/005; B60K 35/00; G01K 3/005; G01K 13/00
USPC ..................................................... 701/29.4
See application file for complete search history.

(56) References Cited

U.S. PATENT DOCUMENTS

| 7,320,562 B1* | 1/2008 | Gromley ............... B65G 51/32 406/176 |
| 2007/0013232 A1* | 1/2007 | McNally ............... B60L 3/0023 307/10.1 |
| 2009/0189420 A1* | 7/2009 | Bohlender ........... B60N 2/5671 219/202 |
| 2018/0065446 A1* | 3/2018 | Hansson ............ B60H 1/00978 |

FOREIGN PATENT DOCUMENTS

KR     20210058167     5/2021

* cited by examiner

*Primary Examiner* — Daniel A Hess
(74) *Attorney, Agent, or Firm* — Lempia Summerfield Katz LLC

(57) ABSTRACT

An apparatus and method for diagnosing a failure in a blower of a vehicle improve performance of various systems using state information of the blower. The apparatus and method include a controller that converts an operating current value supplied to the blower of the vehicle into a voltage value and diagnoses whether the blower fails based on the voltage value. The apparatus and method also include a display that displays whether the blower fails.

17 Claims, 4 Drawing Sheets

APPARATUS AND METHOD FOR DIAGNOSING FAILURE IN A BLOWER OF A VEHICLE

CROSS-REFERENCE TO RELATED APPLICATION

This application claims the benefit of priority to Korean Patent Application No. 10-2019-0160014, filed in the Korean Intellectual Property Office on Dec. 4, 2019, the entire contents of which are incorporated herein by reference.

TECHNICAL FIELD

The present disclosure relates to a technology for diagnosing whether a blower (a heater blower) mounted in a vehicle fails.

BACKGROUND

A thermostat is a coolant flow control device that is mounted at a coolant outlet side of an engine and that opens/closes a coolant passage depending on the temperature of coolant to facilitate warming up and cooling the engine.

The thermostat operates while wax is contracted and expanded by the coolant that is heated to a predetermined temperature (normally, about 82° C.) in the engine. The thermostat introduces the coolant into a radiator to cool the coolant. The cooled coolant is supplied to the engine to cool the engine. This is called a water-cooling cooling apparatus for the engine. When the coolant temperature is low as in the case of cold starting, the thermostat directly supplies the coolant to the engine rather than the radiator to facilitate warming up the engine.

By adjusting the flow of the coolant circulating through the engine as described above, the thermostat facilitates warming up the engine in the case of cold starting and thereafter prevents the engine from being overheated. Accordingly, the thermostat enables the engine to be always stably driven while being maintained at an appropriate temperature.

When the thermostat fails, the thermostat may be maintained in a state of being open toward the radiator (i.e., in a state in which the coolant is introduced into the radiator) or in a closed state. Due to leaking or sticking, warm-up of the engine may be significantly delayed, or overheated coolant may be directly introduced into the engine again to accelerate engine overheating, thereby causing an engine stall.

In general, a technology for diagnosing a failure in the thermostat by using only the temperature of the coolant may misdiagnose whether the thermostat fails or not because the technology does not consider whether a blower (a heater blower) affecting the temperature of the coolant operates or not.

In particular, even though whether the blower operates or not is considered, whether the blower fails or not has to be diagnosed so as not to misdiagnose a failure in the thermostat. However, specific methods have not been proposed yet.

For reference, a technology by which a controller inside the blower generates a failure diagnosis code may be used as a precondition in an embodiment of the present disclosure. However, that technology has to be distinguished from a blower failure diagnosis technology according to an embodiment of the present disclosure.

The above information disclosed in this Background section is only to enhance understanding of the background of the present disclosure. Therefore, the Background section may contain information that does not form any part of the prior art nor what the prior art may suggest to a person of ordinary skill in the art.

SUMMARY

The present disclosure has been made to solve the above-mentioned problems occurring in the prior art while advantages achieved by the prior art are maintained intact.

An aspect of the present disclosure provides a vehicle blower failure diagnosis apparatus and method for improving performance of various systems using state information of a blower of a vehicle, by converting an operating current value supplied to the blower of the vehicle into a voltage value and diagnosing whether the blower fails or not, based on the converted voltage value.

The technical problems to be solved by the present disclosure are not limited to the aforementioned problems, and any other technical problems not mentioned herein should be clearly understood from the following description by those having ordinary skill in the art to which the present disclosure pertains. Also, it should be easily understood that the aspects and advantages of the present disclosure can be accomplished by the means set forth in the appended claims and combinations thereof.

According to an aspect of the present disclosure, an apparatus for diagnosing a failure in a blower of a vehicle includes a controller that converts an operating current value supplied to the blower of the vehicle into a voltage value and diagnoses whether the blower fails based on the voltage value. The apparatus also includes a display that displays whether the blower fails.

The apparatus may further include storage, such as a storage device, that stores a conversion table in which voltage values corresponding to operating current values of the blower are recorded.

The controller may diagnose the blower as being normal when the voltage value exceeds a reference voltage.

The controller may diagnose the blower as having a failure when the voltage value does not exceed a reference voltage and a time during which the voltage value does not exceed the reference voltage exceeds a first reference time. The controller may diagnose the blower as being normal when the voltage value does not exceed the reference voltage and the time during which the voltage value does not exceed the reference voltage does not exceed the first reference time.

The apparatus may further include a voltage sensor that measures voltage of a battery, a coolant temperature sensor that measures temperature of coolant, and an ambient air temperature sensor that measures temperature of ambient air.

The controller may start to diagnose a failure in the blower when the voltage of the battery measured by the voltage sensor is within a reference range, the temperature of the coolant measured by the coolant temperature sensor when an engine starts exceeds a first reference temperature, and the temperature of the ambient air measured by the ambient air temperature sensor exceeds the first reference temperature.

When diagnosing the blower as having a failure, the controller may stand by (i.e., wait or be in an inactive state, pending, idle, or the like) until the temperature of the coolant exceeds a second reference temperature. The controller may perform a failure diagnosis process on the blower again when the temperature of the coolant exceeds the second reference temperature.

The controller may obtain the operating current value supplied to the blower when a step number holding time of the blower exceeds a second reference time.

The controller may obtain the operating current value supplied to the blower when a duty ratio of a Pulse Width Modulation (PWM) signal to control operation of the blower exceeds a reference value.

The controller may obtain the operating current value supplied to the blower when a step number holding time of the blower exceeds a second reference time and a duty ratio of a PWM signal to control operation of the blower exceeds a reference value.

According to another aspect of the present disclosure, a method for diagnosing a failure in a blower of a vehicle includes converting, by a controller, an operating current value supplied to the blower of the vehicle into a voltage value, diagnosing, by the controller, whether the blower fails based on the voltage value, and displaying, by a display, whether the blower fails.

The method may further include storing, by storage, a conversion table in which voltage values corresponding to operating current values of the blower are recorded.

The diagnosing of whether the blower fails may include diagnosing the blower as being normal when the voltage value exceeds a reference voltage, diagnosing the blower as having a failure when the voltage value does not exceed the reference voltage and a time during which the voltage value does not exceed the reference voltage exceeds a first reference time, and diagnosing the blower as being normal when the voltage value does not exceed the reference voltage and the time during which the voltage value does not exceed the reference voltage does not exceed the first reference time.

The method may further include starting to diagnose a failure in the blower when voltage of a battery of the vehicle is within a reference range, temperature of coolant when an engine starts exceeds a first reference temperature, and temperature of ambient air exceeds the first reference temperature.

The method may further include, when the blower is diagnosed as having a failure, standing by until the temperature of the coolant exceeds a second reference temperature and performing a failure diagnosis process on the blower again when the temperature of the coolant exceeds the second reference temperature.

The converting of the operating current value into the voltage value may include obtaining the operating current value supplied to the blower when a step number holding time of the blower exceeds a second reference time.

The converting of the operating current value into the voltage value may include obtaining the operating current value supplied to the blower when a duty ratio of a PWM signal to control operation of the blower exceeds a reference value.

The converting of the operating current value into the voltage value may include obtaining the operating current value supplied to the blower when a step number holding time of the blower exceeds a second reference time and a duty ratio of a PWM signal to control operation of the blower exceeds a reference value.

According to another aspect of the present disclosure, a method for diagnosing a failure in a blower of a vehicle includes starting to diagnose a failure in the blower when voltage of a battery of the vehicle is within a reference range, temperature of coolant when an engine starts exceeds a first reference temperature, and temperature of ambient air exceeds the first reference temperature. The method also includes obtaining an operating current value supplied to the blower when a step number holding time of the blower exceeds a second reference time and a duty ratio of a PWM signal to control operation of the blower exceeds a reference value. The method also includes converting the obtained operating current value into a voltage value, diagnosing the blower as being normal when the voltage value exceeds a reference voltage, diagnosing the blower as having a failure when the voltage value does not exceed the reference voltage and a time during which the voltage value does not exceed the reference voltage exceeds a first reference time, and diagnosing the blower as being normal when the voltage value does not exceed the reference voltage and the time during which the voltage value does not exceed the reference voltage does not exceed the first reference time.

The method may further include, when the blower is diagnosed as having a failure, standing by until the temperature of the coolant exceeds a second reference temperature and performing a failure diagnosis process on the blower again when the temperature of the coolant exceeds the second reference temperature.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
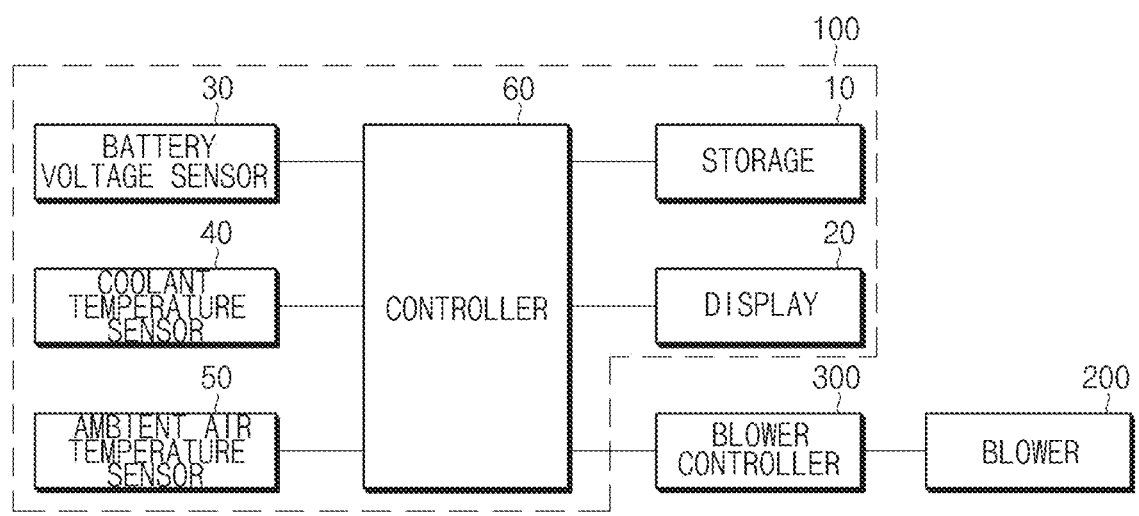
FIG. 1 is a view illustrating a configuration of a vehicle blower failure diagnosis apparatus according to an embodiment of the present disclosure.

Hereinafter, some embodiments of the present disclosure are described in detail with reference to the drawings. In adding the reference numerals to the components of each drawing, it should be noted that the identical or equivalent component is designated by the identical numeral even when they are displayed on other drawings. Further, in describing the embodiments of the present disclosure, a detailed description of well-known features or functions has been omitted in order not to unnecessarily obscure the gist of the present disclosure.

In describing the components of the embodiment according to the present disclosure, terms such as first, second, "A", "B", (a), (b), and the like may be used. These terms are merely intended to distinguish one component from another component, and the terms do not limit the nature, sequence or order of the components. Unless otherwise defined, all terms used herein, including technical or scientific terms, have the same meanings as those generally understood by those having ordinary skill in the art to which the present disclosure pertains. Such terms as those defined in a generally used dictionary are to be interpreted as having meanings equal to the contextual meanings in the relevant field of art.

Such terms are not to be interpreted as having ideal or excessively formal meanings unless clearly defined as having such in the present application.

FIG. 1 is a view illustrating a configuration of a vehicle blower failure diagnosis apparatus according to an embodiment of the present disclosure.

As illustrated in FIG. 1, the vehicle blower failure diagnosis apparatus 100 according to an embodiment of the present disclosure may include storage 10 (i.e., a storage device 10), a display 20, a battery voltage sensor 30, a coolant temperature sensor 40, an ambient air temperature sensor 50, and a controller 60. Depending on a way of carrying out the vehicle blower failure diagnosis apparatus 100 according to an embodiment of the present disclosure, the components may be combined together to form one entity or some of the components may be omitted.

The storage 10 may store various logics, algorithms, and programs required in a process of determining, as a failure diagnosis start condition for a blower 200, whether the voltage of a battery in a vehicle is within a reference range (e.g., a range of 10V to 16V), whether the temperature of coolant when an engine of the vehicle starts exceeds a first reference temperature (e.g., −10° C.), and whether the temperature of ambient air exceeds the first reference temperature (e.g., −10° C.)

The storage 10 may store various logics, algorithms, and programs required in a process of converting an operating current value supplied to the blower 200 of the vehicle into a voltage value and diagnosing whether the blower 200 fails based on the converted voltage value.

The storage 10 may store various logics, algorithms, and programs required in a process of determining, as a condition for improving failure diagnosis performance for the blower 200, whether the step number (the operating level) of the blower 200 is changed within a second reference time (e.g., 1 second), whether the duty ratio of a Pulse Width Modulation (PWM) signal to control operation of the blower 200 exceeds a reference value (e.g., 30%), and whether the temperature of the coolant exceeds a second reference temperature (e.g., 20° C.)

For reference, the PWM signal is constituted by 1 (supply of power) and 0 (power shut-off), and the duty ratio is determined depending on the percentage of 1. For example, when one half of a period is represented as 1 and the other half is represented as 0, the duty ratio of the PWM signal is 50%. In another example, when a quarter of a period is represented as 1 and the remaining three quarters are represented as 0, the duty ratio is 25%.

The storage 10 may store the reference range (e.g., a range of 10V to 16V), the first reference temperature (e.g., −10° C.), the first reference time (e.g., 5 seconds), the second reference time (e.g., 1 second), the reference value (e.g., 30%), the second reference temperature (e.g., 20° C.), and the reference voltage (e.g., 1V). The numerical values may be varied depending on a designer's intention.

The storage 10 may store a conversion table in which voltage values corresponding to operating current values of the blower 200 are recorded. For example, the conversion table is as shown in Table 1 below.

TABLE 1

| Blower Operating Current (A) | Converted Voltage (V) |
|---|---|
| 2 | 1 |
| 8 | 4.6 |

TABLE 1-continued

| Blower Operating Current (A) | Converted Voltage (V) |
|---|---|
| 12 | 6 |
| 20 | 11.2 |

The storage 10 may include at least one type of storage medium among memories of a flash memory type, a hard disk type, a micro type, and a card type (e.g., a Secure Digital (SD) card or an eXtream Digital (XD) card) and memories of a Random Access Memory (RAM) type, a Static RAM (SRAM) type, a Read-Only Memory (ROM) type, a Programmable ROM (PROM) type, an Electrically Erasable PROM (EEPROM) type, a Magnetic RAM (MRAM) type, a magnetic disk type, and an optical disk type.

The display 20 may be implemented with a cluster, an Audio Video Navigation (AVN) system, a Head-Up Display (HUP), or the like. The display 20 may provide an outcome of diagnosing a failure in the blower 200 to a user in various forms such as text, an icon, an image, and the like.

The battery voltage sensor 30 may measure the voltage of the battery. In an embodiment of the present disclosure, the voltage of the battery may be obtained through the battery voltage sensor 30. However, in another embodiment, the vehicle blower failure diagnosis apparatus 100 may obtain various pieces of information about the battery in conjunction with a Battery Management System (BMS) included in the vehicle.

The coolant temperature sensor 40 may measure the temperature of the coolant. In other words, the coolant temperature sensor 40 may measure the coolant temperature during operation of the engine as well as the coolant temperature when the engine starts. In an embodiment of the present disclosure, the temperature of the coolant may be obtained through the coolant temperature sensor 40. However, in another embodiment, the vehicle blower failure diagnosis apparatus 100 may obtain temperature information of the coolant in conjunction with an Engine Control Unit (ECU) included in the vehicle.

The ambient air temperature sensor 50 may measure the temperature of the ambient air. In an embodiment of the present disclosure, the temperature of the ambient air may be obtained through the ambient air temperature sensor 50. However, in another embodiment, the vehicle blower failure diagnosis apparatus 100 may obtain temperature information of the ambient air in conjunction with an Air Conditioning System (ACS) included in the vehicle.

The controller 60 performs overall control to enable the components to normally perform functions thereof. The controller 60 may be implemented in the form of hardware, software, or a combination thereof. The controller 60 may be implemented with, but is not limited to, a microprocessor.

In particular, the controller 60 may perform various controls in the process of determining, as the failure diagnosis start condition for the blower 200, whether the voltage of the battery in the vehicle is within the reference range (e.g., a range of 10V to 16V), whether the temperature of the coolant when the engine of the vehicle starts exceeds the first reference temperature (e.g., −10° C.), and whether the temperature of the ambient air exceeds the first reference temperature (e.g., −10° C.)

In other words, the controller 60 may start to diagnose a failure in the blower 200 when the voltage of the battery measured by the battery voltage sensor 30 is within the reference range, the temperature of the coolant measured by the coolant temperature sensor 40 exceeds the first reference temperature, and the temperature of the ambient air measured by the ambient air temperature sensor 50 exceeds the first reference temperature.

Furthermore, the controller 60 may perform various controls in the process of converting the operating current value supplied to the blower 200 of the vehicle into the voltage value and diagnosing whether the blower 200 fails based on the converted voltage value.

In other words, based on the conversion table stored in the storage 10, the controller 60 may convert the operating current value of the blower 200, which is obtained from a blower controller 300, into a voltage value. When the converted voltage value exceeds the reference voltage, the controller 60 may diagnose the blower 200 as being normal. When the converted voltage value does not exceed the reference voltage, the controller 60 may count time. When the time during which the converted voltage value does not exceed the reference voltage (the reference voltage value) exceeds the first reference time, the controller 60 may diagnose the blower 200 as having a failure. When the time during which the converted voltage value does not exceed the reference voltage does not exceed the first reference time, the controller 60 may diagnose the blower 200 as being normal.

The controller 60 may firstly diagnose the blower 200 as having a failure and may wait for warm-up of the engine until the temperature of the coolant exceeds the second reference temperature. Thereafter, when the temperature of the coolant exceeds the second reference temperature, the controller 60 may perform a failure diagnosis process on the blower 200 again and may finally diagnose whether the blower 200 fails.

In addition, the controller 60 may perform various controls in the process of determining, as the condition for improving the failure diagnosis performance for the blower 200, whether the step number (the operating level) of the blower 200 is changed within the second reference time (e.g., 1 second) and whether the duty ratio of the Pulse Width Modulation (PWM) signal to control operation of the blower 200 exceeds the reference value (e.g., 30%).

Hereinafter, a process of improving, by the controller 60, the failure diagnosis performance for the blower 200 is described in detail.

The controller 60 may improve the failure diagnosis performance by calculating a step number holding time of the blower 200 based on information about the step number of the blower 200 that is obtained from the blower controller 300. The controller 60 may also improve the failure diagnosis performance by obtaining the operating current value of the blower 200 from the blower controller 300 when the calculated step number holding time of the blower 200 exceeds the second reference time. The blower controller 300 transmits information about the step number of the blower 200 to the controller 60 every time the step number of the blower 200 is changed.

The controller 60 may improve the failure diagnosis performance by obtaining the duty ratio of the PWM signal to control operation of the blower 200 from the blower controller 300 and obtaining the operating current value of the blower 200 from the blower controller 300 when the obtained duty ratio exceeds the reference value.

The controller 60 may improve the failure diagnosis performance by calculating a step number holding time of the blower 200 based on information about the step number of the blower 200 that is obtained from the blower controller 300. The controller 60 may also improve the failure diagnosis performance by obtaining the operating current value of the blower 200 from the blower controller 300 when the calculated step number holding time of the blower 200 exceeds the second reference time and the duty ratio of the PWM signal to control operation of the blower 200, which is obtained from the blower controller 300, exceeds the reference value.

In a state of starting to diagnose a failure in the blower 200 based on the voltage of the battery measured by the battery voltage sensor 30, the temperature of the coolant measured by the coolant temperature sensor 40, and the temperature of the ambient air measured by the ambient air temperature sensor 50, the controller 60 may diagnose whether the blower 200 fails based on a failure diagnosis code received from the blower controller 300. The failure diagnosis code may include, for example, 0x1:stall, 0x2:over current, 0x3: over temperature, or the like.

For reference, the blower controller 300 may be implemented with a micro-computer and may not only control overall operation of the blower 200 but may also diagnose a failure in the blower 200 by itself. The failure diagnosis process of the blower controller 300 is a well-known and common technology, and therefore detailed description thereabout has been omitted.

The controller 60 may be connected to a vehicle network and may collect various pieces of information required to diagnose a failure in the blower 200. The vehicle network may include a Controller Area Network (CAN), a Local Interconnect Network (LIN), FlexRay, Media Oriented Systems Transport (MOST), Ethernet, or the like.

Figure 2:
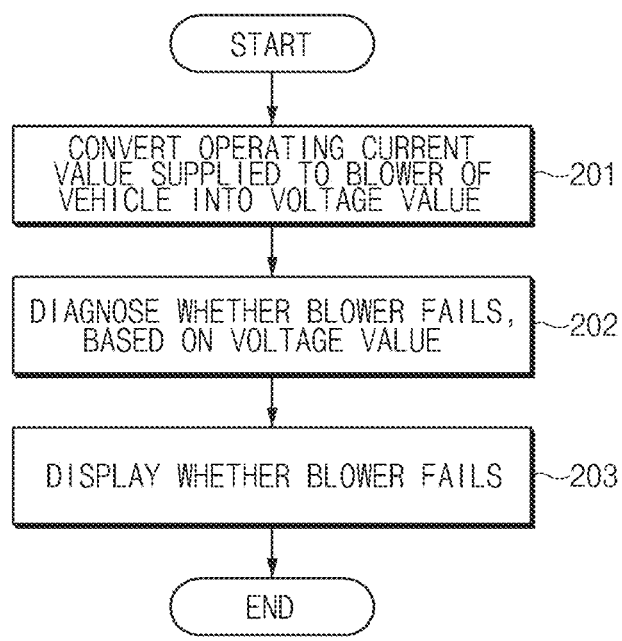
FIG. 2 is a flowchart illustrating a vehicle blower failure diagnosis method according to an embodiment of the present disclosure.

FIG. 2 is a flowchart illustrating a vehicle blower failure diagnosis method according to an embodiment of the present disclosure.

First, the controller 60 converts an operating current value supplied to the blower 200 of the vehicle into a voltage value (201).

Next, the controller 60 diagnoses whether the blower 200 fails based on the voltage value (202).

Then, the display 20 displays whether the blower 200 fails (203).

Figure 3:
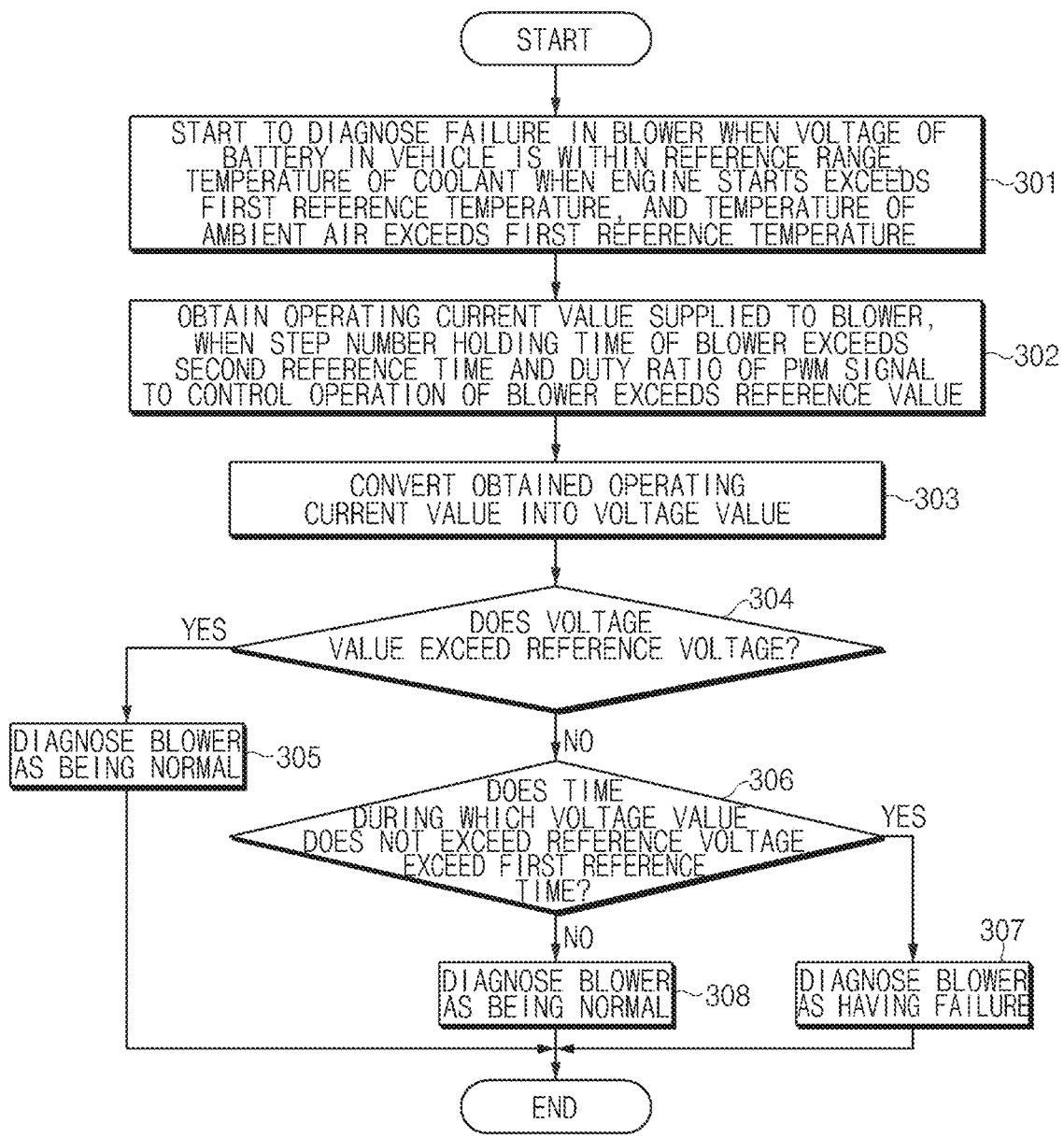
FIG. 3 is a flowchart illustrating a vehicle blower failure diagnosis method according to another embodiment of the present disclosure.

FIG. 3 is a flowchart illustrating a vehicle blower failure diagnosis method according to another embodiment of the present disclosure, where FIG. 3 illustrates a process performed by the controller 60.

First, the controller 60 starts to diagnose a failure in the blower 200 when the voltage of the battery in the vehicle is within the reference range, the temperature of the coolant when the engine starts exceeds the first reference temperature, and the temperature of the ambient air exceeds the first reference temperature (301).

Next, the controller 60 obtains an operating current value supplied to the blower 200 when the step number holding time of the blower 200 exceeds the second reference time and the duty ratio of the PWM signal to control operation of the blower 200 exceeds the reference value (302).

Then, the controller 60 converts the obtained operating current value into a voltage value (303).

After that, the controller 60 determines whether the voltage value exceeds the reference voltage (304).

When it is determined that the voltage value exceeds the reference voltage (304), the controller 60 diagnoses the blower 200 as being normal (305).

When it is determined that the voltage value does not exceed the reference voltage (304), the controller 60 determines whether the time during which the voltage value does not exceed the reference voltage exceeds the first reference time (306).

When it is determined that the time during which the voltage value does not exceed the reference voltage exceeds the first reference time, the controller 60 diagnoses the blower 200 as having a failure (307).

When it is determined that the time during which the voltage value does not exceed the reference voltage does not exceed the first reference time (306), the controller 60 diagnoses the blower 200 as being normal (308).

Figure 4:
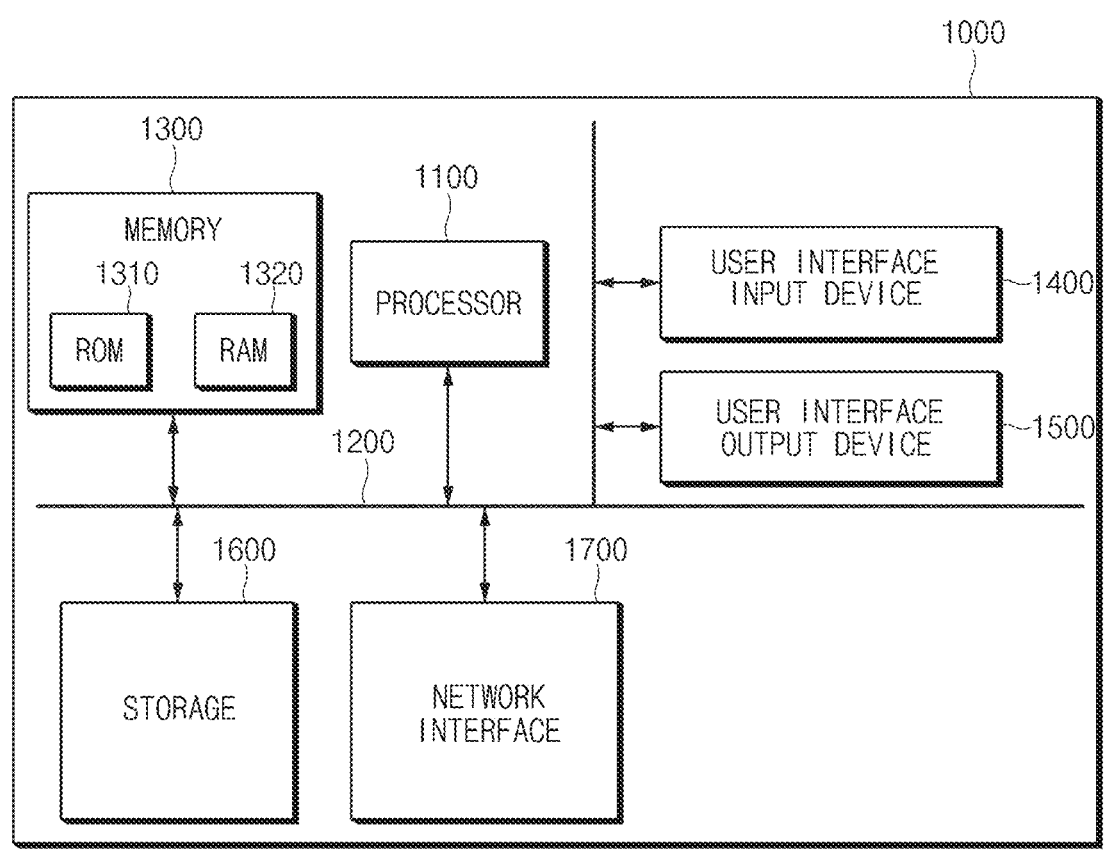
FIG. 4 is a block diagram illustrating a computing system for executing the vehicle blower failure diagnosis methods, according to an embodiment of the present disclosure.

FIG. 4 is a block diagram illustrating a computing system for executing the vehicle blower failure diagnosis methods according to an embodiment of the present disclosure.

Referring to FIG. 4, the computing system 1000 may include at least one processor 1100, a memory 1300, a user interface input device 1400, a user interface output device 1500, storage 1600, and a network interface 1700, which are connected with each other via a bus 1200.

The processor 1100 may be a central processing unit (CPU) or a semiconductor device that processes instructions stored in the memory 1300 and/or the storage 1600. The memory 1300 and the storage 1600 may include various types of volatile or non-volatile storage media. For example, the memory 1300 may include a ROM (Read Only Memory) 1310 and a RAM (Random Access Memory) 1320.

Thus, the operations of the method or the algorithm described in connection with the embodiments disclosed herein may be embodied directly in hardware or a software module executed by the processor 1100, or in a combination thereof. The software module may reside on a storage medium (i.e., the memory 1300 and/or the storage 1600) such as a RAM, a flash memory, a ROM, an EPROM, an EEPROM, a register, a hard disk, a removable disk, or a CD-ROM. The storage medium may be coupled to the processor 1100, and the processor 1100 may read information out of the storage medium and may record information in the storage medium. Alternatively, the storage medium may be integrated with the processor 1100. The processor 1100 and the storage medium may reside in an application specific integrated circuit (ASIC). The ASIC may reside within a user terminal. In another case, the processor 1100 and the storage medium may reside in the user terminal as separate components.

According to the embodiments of the present disclosure, the vehicle blower failure diagnosis apparatus and method may improve performance of various systems using state information of the blower of the vehicle, by converting the operating current value supplied to the blower of the vehicle into the voltage value and diagnosing whether the blower fails or not based on the converted voltage value.

Although the present disclosure has been described with reference to embodiments and the accompanying drawings, the present disclosure is not limited thereto, but may be variously modified and altered by those having ordinary skill in the art to which the present disclosure pertains without departing from the spirit and scope of the present disclosure claimed in the following claims.

Therefore, the embodiments of the present disclosure are provided to explain the spirit and scope of the present disclosure, but not to limit them, so that the spirit and scope of the present disclosure is not limited by the embodiments. The scope of the present disclosure should be construed based on the accompanying claims, and all the technical ideas within the scope equivalent to the claims should be included in the scope of the present disclosure.

What is claimed is:

1. An apparatus for diagnosing a failure in a blower of a vehicle, the apparatus comprising:
    a controller configured to convert an operating current value supplied to the blower of the vehicle into a voltage value and diagnose whether the blower fails based on the voltage value;
    a display configured to display whether the blower fails;
    a voltage sensor configured to measure voltage of a battery;
    a coolant temperature sensor configured to measure temperature of coolant; and
    an ambient air temperature sensor configured to measure temperature of ambient air,
    wherein the controller starts to diagnose a failure in the blower when the voltage of the battery measured by the voltage sensor is within a reference range, the temperature of the coolant measured by the coolant temperature sensor when an engine starts exceeds a first reference temperature, and the temperature of the ambient air measured by the ambient air temperature sensor exceeds the first reference temperature.

2. The apparatus of claim 1, further comprising:
    storage configured to store a conversion table in which voltage values corresponding to operating current values of the blower are recorded.

3. The apparatus of claim 1, wherein the controller diagnoses the blower as being normal when the voltage value exceeds a reference voltage.

4. The apparatus of claim 1, wherein the controller diagnoses the blower as having a failure when the voltage value does not exceed a reference voltage and a time during which the voltage value does not exceed the reference voltage exceeds a first reference time, and wherein the controller diagnoses the blower as being normal when the voltage value does not exceed the reference voltage and the time during which the voltage value does not exceed the reference voltage does not exceed the first reference time.

5. The apparatus of claim 1, wherein when diagnosing the blower as having a failure, the controller stands by until the temperature of the coolant exceeds a second reference temperature and performs a failure diagnosis process on the blower again when the temperature of the coolant exceeds the second reference temperature.

6. The apparatus of claim 1, wherein the controller obtains the operating current value supplied to the blower when a step number holding time of the blower exceeds a second reference time.

7. The apparatus of claim 1, wherein the controller obtains the operating current value supplied to the blower when a duty ratio of a Pulse Width Modulation (PWM) signal to control operation of the blower exceeds a reference value.

8. The apparatus of claim 1, wherein the controller obtains the operating current value supplied to the blower when a step number holding time of the blower exceeds a second reference time and a duty ratio of a PWM signal to control operation of the blower exceeds a reference value.

9. A method for diagnosing a failure in a blower of a vehicle, the method comprising:
    converting, by a controller, an operating current value supplied to the blower of the vehicle into a voltage value;
    diagnosing, by the controller, whether the blower fails based on the voltage value;
    displaying, by a display, whether the blower fails; and
    starting to diagnose a failure in the blower when voltage of a battery of the vehicle is within a reference range, temperature of coolant when an engine starts exceeds a first reference temperature, and temperature of ambient air exceeds the first reference temperature.

10. The method of claim 9, further comprising:
storing, by storage, a conversion table in which voltage values corresponding to operating current values of the blower are recorded.

11. The method of claim 9, wherein the diagnosing of whether the blower fails includes:
diagnosing the blower as being normal when the voltage value exceeds a reference voltage;
diagnosing the blower as having a failure when the voltage value does not exceed the reference voltage and a time during which the voltage value does not exceed the reference voltage exceeds a first reference time; and
diagnosing the blower as being normal when the voltage value does not exceed the reference voltage and the time during which the voltage value does not exceed the reference voltage does not exceed the first reference time.

12. The method of claim 9, further comprising:
when the blower is diagnosed as having a failure, standing by until the temperature of the coolant exceeds a second reference temperature and performing a failure diagnosis process on the blower again when the temperature of the coolant exceeds the second reference temperature.

13. The method of claim 9, wherein the converting of the operating current value into the voltage value includes:
obtaining the operating current value supplied to the blower when a step number holding time of the blower exceeds a second reference time.

14. The method of claim 9, wherein the converting of the operating current value into the voltage value includes:
obtaining the operating current value supplied to the blower when a duty ratio of a Pulse Width Modulation (PWM) signal to control operation of the blower exceeds a reference value.

15. The method of claim 9, wherein the converting of the operating current value into the voltage value includes:
obtaining the operating current value supplied to the blower when a step number holding time of the blower exceeds a second reference time and a duty ratio of a PWM signal to control operation of the blower exceeds a reference value.

16. A method for diagnosing a failure in a blower of a vehicle, the method comprising:
starting to diagnose a failure in the blower when voltage of a battery of the vehicle is within a reference range, temperature of coolant when an engine starts exceeds a first reference temperature, and temperature of ambient air exceeds the first reference temperature;
obtaining an operating current value supplied to the blower when a step number holding time of the blower exceeds a second reference time and a duty ratio of a Pulse Width Modulation (PWM) signal to control operation of the blower exceeds a reference value;
converting the obtained operating current value into a voltage value;
diagnosing the blower as being normal when the voltage value exceeds a reference voltage;
diagnosing the blower as having a failure when the voltage value does not exceed the reference voltage and a time during which the voltage value does not exceed the reference voltage exceeds a first reference time; and
diagnosing the blower as being normal when the voltage value does not exceed the reference voltage and the time during which the voltage value does not exceed the reference voltage does not exceed the first reference time.

17. The method of claim 16, further comprising:
when the blower is diagnosed as having a failure, standing by until the temperature of the coolant exceeds a second reference temperature and performing a failure diagnosis process on the blower again when the temperature of the coolant exceeds the second reference temperature.

* * * * *